United States Patent [19]
Barrett

[11] Patent Number: 5,933,324

[45] Date of Patent: Aug. 3, 1999

[54] APPARATUS FOR DISSIPATING HEAT FROM A CONDUCTIVE LAYER IN A CIRCUIT BOARD

[75] Inventor: Joseph C. Barrett, El Dorado, Calif.

[73] Assignee: Intel Corporation, Santa Clara, Calif.

[21] Appl. No.: 08/991,957

[22] Filed: Dec. 16, 1997

[51] Int. Cl.⁶ .................................................. H05K 7/20
[52] U.S. Cl. .................. 361/703; 361/704; 361/707; 361/718; 361/719; 257/717; 174/16.3; 174/16.1; 165/80.3; 165/185
[58] Field of Search ................................. 361/688, 702, 361/704, 712, 717–720; 257/706, 712, 717, 718, 721, 722; 165/80.2, 80.3; 174/16.3

[56] References Cited

U.S. PATENT DOCUMENTS

| | | | |
|---|---|---|---|
| 4,682,269 | 7/1987 | Pitasi | 361/704 |
| 4,698,663 | 10/1987 | Sugimoto et al. | 361/718 |
| 4,720,770 | 1/1988 | Jameson | 361/704 |
| 4,823,234 | 4/1989 | Konishi et al. | 361/718 |
| 5,113,315 | 5/1992 | Capp et al. | 361/704 |
| 5,561,324 | 10/1996 | Kozono et al. | 361/718 |
| 5,659,458 | 8/1997 | Patchen | 361/704 |
| 5,661,902 | 9/1997 | Katchmar | 361/719 |

*Primary Examiner*—Leo P. Picard
*Assistant Examiner*—Boris L. Cherwinsky
*Attorney, Agent, or Firm*—Cindy T. Faatz

[57] ABSTRACT

An apparatus for dissipating heat transferred to a circuit board. A board on which to mount an electronic device includes a conductive layer. A first board heat dissipation element is thermally coupled to the conductive layer and extends away from a surface of the board to dissipate heat from the conductive layer to the ambient.

17 Claims, 6 Drawing Sheets

5,933,324

APPARATUS FOR DISSIPATING HEAT FROM A CONDUCTIVE LAYER IN A CIRCUIT BOARD

FIELD OF THE INVENTION

The present invention relates generally to heat dissipation for circuit boards, and more particularly, to a board heat dissipation element coupled to a circuit board to dissipate to the ambient heat transferred to the circuit board.

BACKGROUND OF THE INVENTION

Efficient and effective integrated circuit device heat dissipation during operation is increasingly important as integrated circuit device power consumption continues to rise. This is particularly true for highly integrated devices such as microprocessors and microprocessor chipsets, for example. Ineffective heat dissipation may lead to reliability issues and shorten the useful life of an integrated circuit device.

To prevent such issues, many different types of heat dissipation approaches have been used. For example, system fans, heat pipes and heat sinks coupled to device packages are often provided in an effort to dissipate heat generated by integrated circuit and other electronic devices as quickly as possible. The approach used to dissipate heat for a particular device may depend on the type of package in which the device is provided, the manner in which the device is connected to a system board, and/or the system in which the device will be operating.

Integrated circuit devices, for example, can be provided in many different packages. A particular package may be chosen for a particular integrated circuit device based on many factors including cost, input/output requirements, ease of manufacturing and/or the system in which the package is to be installed. One type of integrated circuit device package is a plastic ball grid array (PBGA) package. A PBGA package may be used, for example, for an integrated circuit device that requires an inexpensive, relatively high input/output count, low profile package.

FIG. 1 shows a cross-sectional view of an integrated circuit device 100 in a PBGA package 102 mounted on a printed circuit board 105. The signal terminals 110 (solder balls for a PBGA package) are electrically coupled to particular traces on the printed circuit board 105 such that the proper signals are supplied to and received from the integrated circuit die 115 within the package 102.

The PBGA package 102 of FIG. 1 also includes several package ground terminals 120 that are provided on the package 102 directly beneath the integrated circuit die 115. The package ground terminals 120 are electrically and thermally coupled to one or more conductive ground layers 125 by vias that extend from a surface of the printed circuit board 105 through the conductive ground layer(s) 125. The package ground terminals 120 provide ground connections for the package 102. The package ground terminals are also provided to dissipate heat from the integrated circuit device 100 into the ground layer(s) 125 of the printed circuit board 105. In this manner, the board 105 acts as a passive heat sink for integrated circuit device 100. The package 102 is referred to as a thermally-enhanced PBGA package because of the manner in which the ground terminals 120 are used.

The above approach, while effective in initially transferring heat away from the die 115, has some disadvantages. The board 105 includes insulating layers 130 on either side of the one or more ground layers 125. The insulating layers 130 are typically formed of fiberglass or another insulating material. While the package ground terminals 120 and conductive ground layer(s) 125 help to transfer heat away from the integrated circuit die 115 into the printed circuit board 105, the insulating layers 130 prevent the transferred heat from being easily dissipated into the ambient. Vias (not shown) across the board 105 provide the only path for the transferred heat to reach the air, but their surface area is insufficient to provide a significant cooling rate.

FIG. 2 is an overhead view of the integrated circuit device 100 of FIG. 1 mounted on the printed circuit board 105 along with other integrated circuit and/or electronic devices 205 and 210. The arrows extending from the perimeter of each of the devices 100, 205 and 210 shows approximate patterns of heat radiation from each device. As shown, the heat conducted away from the die 115 (FIG. 1) and into the ground layer(s) 125 of FIG. 1 may reach other devices 205 and 210, causing the area around such devices to heat up. Similarly, heat transferred from the other devices 205 and 210 to the board 105 may reach the integrated circuit device 100 reducing the effectiveness of the above-described heat dissipation approach.

Another approach is described in U.S. Pat. No. 5,617,294 to Watson et al. ("Watson") which is assigned to the assignee of the present invention. In Watson, a heat slug is installed within an opening in a printed circuit board and an integrated circuit package is attached to a bottom portion of the heat slug such that the heat slug conducts heat away from the integrated circuit package during operation. The heat slug of one embodiment of Watson, however is connected to a ground plane in the printed circuit board such that heat can also be conducted from the integrated circuit package to the ground plane. While the heat slug may be effective in initially conducting heat away from the integrated circuit device, the heat conducted to the ground plane is not easily dissipated.

SUMMARY OF THE INVENTION

An apparatus for dissipating heat from a circuit board is described. The apparatus comprises a board on which to mount an electronic device wherein the board includes a conductive layer. A first board heat dissipation element is thermally coupled to the conductive layer and extends away from a surface of the board to dissipate heat from the conductive layer to the ambient.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

An apparatus for dissipating heat transferred to a circuit board is described. Although the embodiments described below refer to an integrated circuit device in a plastic ball grid array (PBGA) package for purposes of illustration, it will be appreciated that other types of electronic devices and/or integrated circuit devices in other types of packages, such as column grid array or pin grid array packages, for example, may also be used with various embodiments.

An intended advantage of one or more embodiments is to effectively dissipate to the ambient heat transferred to a board by an integrated circuit or other electronic device by increasing the board heat dissipation surface area. Other intended advantages of one or more embodiments include a reduced need for heat sinks, heat pipes or other integrated circuit heat removal devices. Further advantages will be appreciated from the description that follows.

For one embodiment, one or more heat dissipation elements are thermally coupled to a conductive layer in a printed circuit board. The heat dissipation element(s) is connected to the printed circuit board close to an area on which an integrated circuit device is mounted or is to be mounted. During operation of the integrated circuit device, heat is conducted from the integrated circuit device to the conductive layer in the printed circuit board and from the conductive layer through the heat dissipation element(s) to the ambient. The heat dissipation element(s) operates to increase the board heat dissipation surface area over which air flows to remove the heat to the ambient. Additional details of various embodiments are described below with reference to FIGS. 3–7.

Figure 1:
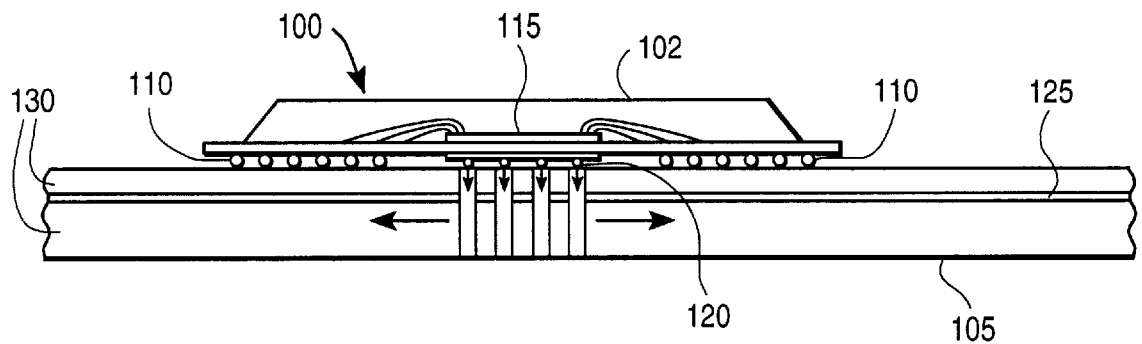
FIG. 1 shows a cross-section of an integrated circuit device in a thermally-enhanced plastic ball grid array (PBGA) package mounted on a prior circuit board.
Figure 2:
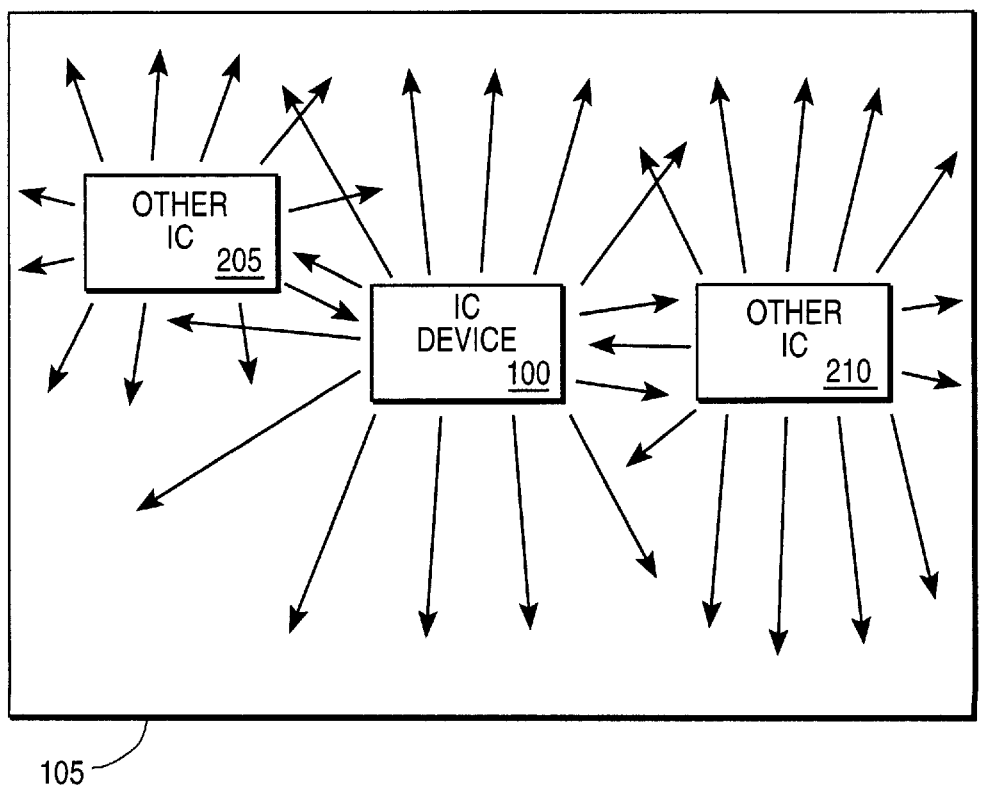
FIG. 2 is a top view showing approximate heat radiation patterns of the integrated circuit device of FIG. 1 and surrounding components.
Figure 3:
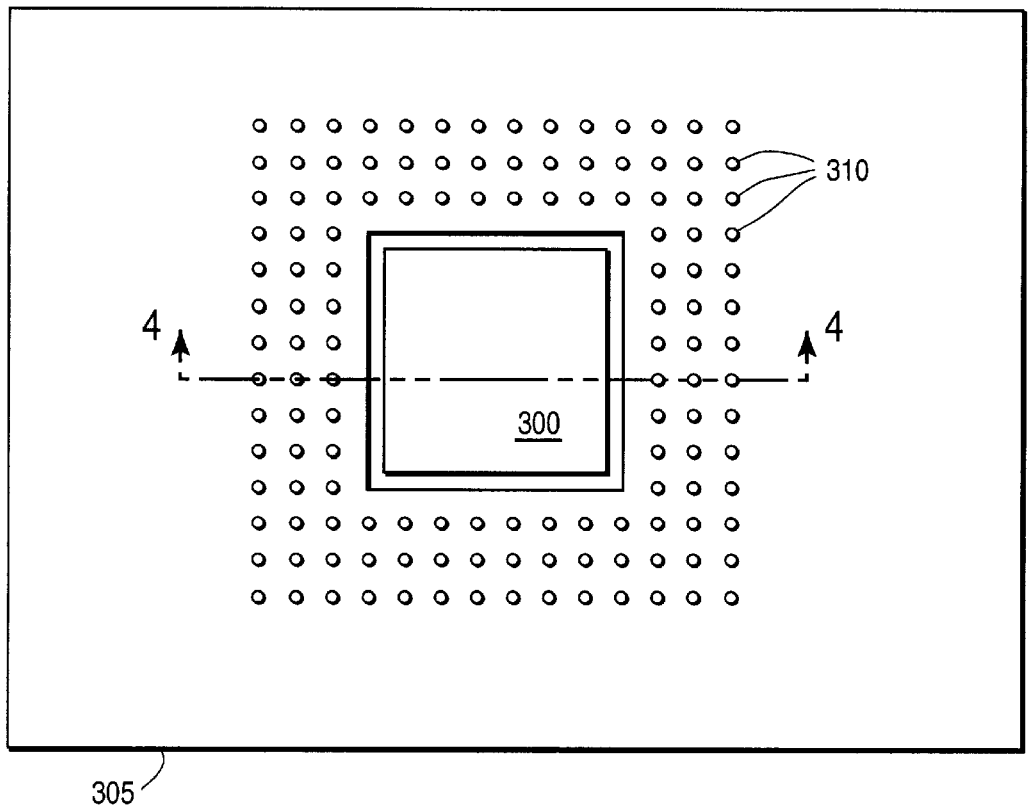
FIG. 3 is a top view of an integrated circuit device mounted on a circuit board of one embodiment that includes an array of conductive pins as board heat dissipation elements.

FIG. 3 is a top view of a packaged integrated circuit (IC) device 300. The integrated circuit device 300 is surface-mounted on a board 305 of one embodiment. The board 305 may extend further in one or more directions away from the integrated circuit device 300 and may include other integrated circuit components not shown in FIG. 3.

An array of board heat dissipation elements, in this case thermally conductive pins 310, is connected to the board 305 in a pattern surrounding the package 300 or a footprint of the package 300 if the package is not present. For one embodiment, the thermally conductive pins 310 are arranged on a. 0.1 inch grid with the pins closest to the packaged IC device 300 separated from the IC device 300 by the same distance.

While the array including the conductive pins 310 of FIG. 3 is three pins deep from any side of the packaged IC device 300, a different number of conductive pins in a different arrangement and with different spacing may be used for other embodiments. The arrangement and spacing of the pins 310 and other heat dissipation elements described below may depend on many factors such as the useable space around the integrated circuit device to be cooled, routing considerations, and the system in which the board 305 is to be used.

For one embodiment, the pins 310 take up little to no additional useable surface area on the board. This is because the area of the board 305 in which the pins 310 are mounted frequently is used for dense underlying signal routing in other layers (not shown) of the board 305. For this reason, other integrated circuit devices cannot be mounted in this area. Mounting of the heat dissipation elements in this area therefore does not require a change in component layout or routing for circuit boards for which this is the case.

Figure 4:
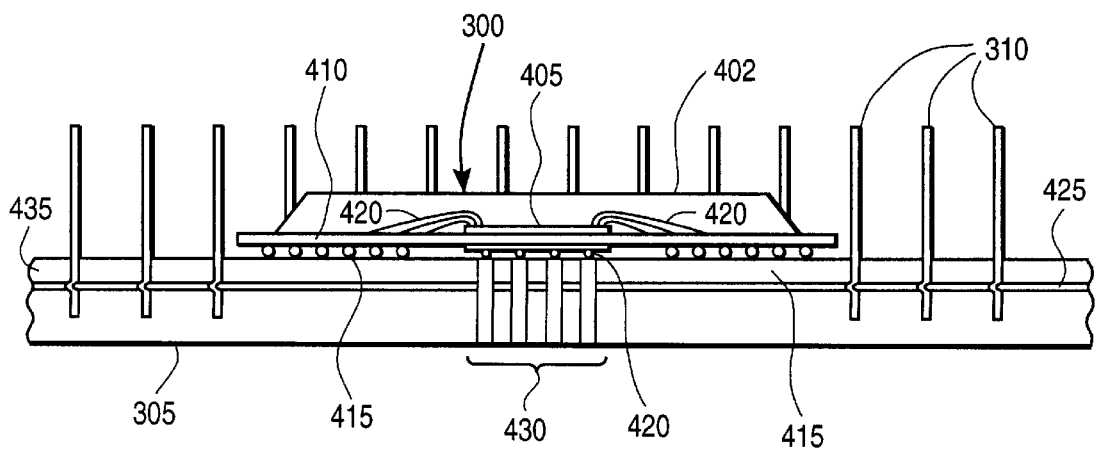
FIG. 4 is a cross-section of the integrated circuit device, circuit board and board heat dissipation elements of FIG. 3 taken along the line 4—4.

FIG. 4 shows a cross-sectional view of the board 305, packaged IC device 300 and array of pins 310 taken at the line 4—4. For this example, the IC device 300 is packaged in a PBGA package 402. The PBGA package 402 includes an integrated circuit die 405 mounted on a substrate 410. The integrated circuit die 405 is electrically connected to solder ball signal terminals 415 of the PBGA package 402 by bond wires 420. For other types of packages, the signal terminals may be pins, pads or columns, for example. The signal terminals 415 are electrically coupled to traces (not shown) on the integrated circuit board 305 such that in operation, the proper signals are transmitted to and from the integrated circuit die 405 via the signal terminals 415.

The PBGA package 402 is a thermally-enhanced PEBGA package and includes package ground/cooling terminals 420 as described above. For one embodiment, the ground/cooling terminals 420 are arranged in an array across an area of the underside of the package 402 approximately equivalent to the area of the die 405. The package ground/cooling terminals 420 are disposed on the PBGA package 402 directly beneath the die 115 on the surface of the package 402 closest to the board 305 when the package 402 is mounted on the board. The package ground/cooling terminals 420 are electrically and thermally coupled to one or more ground layers 425 of the board 305 by vias 430. The vias 430 are formed of a conductive material and extend from a top surface of the board 305 through an insulating layer 435 to the one or more ground layers 425. The top surface of the board 305 in this case is the surface on which the PBGA package 402 is mounted. Another insulating layer 440 is provided on the opposite side of the ground layer(s) 425.

The thermally conductive pins 310 are thermally coupled to one or more ground layers 425 and extend away from a surface of the board 305. For one embodiment, as shown in FIG. 4, the longitudinal axis of each of the pins 310 forms approximately a right angle with the top surface of the board 305. The particular height chosen for the pins 310 may depend on many factors including the system in which the board 305 is to be used, the height of the package 402 above the board surface, and the availability of other cooling means or mechanisms. For one embodiment, all of the pins 310 are approximately the same height above the surface of the board 305 wherein the height is in the range of 200 thousandths of an inch to one inch.

The thermally conductive pins 310 of one embodiment are formed of gold/nickel or tin/nickel over brass, phosphor bronze or copper. For other embodiments, however, the conductive pins 310 may be formed of another material having a low thermal resistance and sufficient rigidity to extend away from the board 305 in the operating temperature range of a system that includes the PBGA package 402.

Also, the thermally conductive pins 310 of one embodiment are dedicated board heat dissipation elements. That is to say, the conductive pins 310 are used solely for the purpose of dissipating heat from the board 305 to the ambient. More specifically, the thermally conductive pins 310 of one embodiment are not used to interconnect devices or signal paths or for any purpose other than dissipating heat transferred to the board 305 from any source to the ambient.

The thermally conductive pins 310 may be thermally coupled to the ground layer(s) 425 in any manner. For one embodiment, the conductive pins are press-fit pins that are commonly used as jumpers to interconnect devices or conductive regions. For example, one of a variety of press-fit pins supplied by Autosplice, Inc. of San Diego, Calif. may be used. Press-fit pins can be automatically picked, placed and inserted into corresponding plated through holes in the printed circuit board using pick-and-place and/or automatic insertion equipment. The plated through holes in the printed circuit board provide a conductive path to the ground layer(s) 425 such that the pins 310 are directly connected to the ground layer(s) 425. For another embodiment, the conductive pins 310 are a different type of pin connected to the board 305 in the same or a different manner such as through manual insertion or soldering. Further, the conductive pins 310 may be connected to the ground layer(s) 425 through vias that extend from the surface of the printed circuit board to the ground layer.

In operation, the integrated circuit device 300 heats up as power is supplied to the die 405. Heat from the die 405 is then transferred by the ground/cooling terminals 420 through the vias 430 to the ground layer(s) 425. The transferred heat is conducted along the ground layer(s) 425 away from the integrated circuit device 300 in all directions to the conductive pins 310 that substantially surround the integrated circuit device 300. The transferred heat is then conducted by the conductive pins 310 to the ambient. In this manner, heat transferred from the die 405 to the ground layer(s) 425 can be more quickly and easily dissipated to the air around the board 305 which is also referred to as the ambient.

The conductive pins 310 act to increase the board heat dissipation surface area exposed to the ambient around the PBGA package 402. Further, the increased surface area provided by the conductive pins 310 is directly connected to the ground layer(s) 425 to which the heat from the die 405 is transferred. The cooling rate of the board 305 and integrated circuit device 300 assembly is thereby increased as compared to a similar board and integrated circuit device assembly that does not include the conductive pins 310. Further, much of the heat transferred to the board 305 from other integrated circuit devices (not shown) around the packaged IC device 300 can also be dissipated by the conductive pins 310 before it reaches the device 300.

In place of the array of conductive pins 310 shown in FIGS. 3 and 4, other types of board heat dissipation elements may be used for other embodiments.

Figure 5:
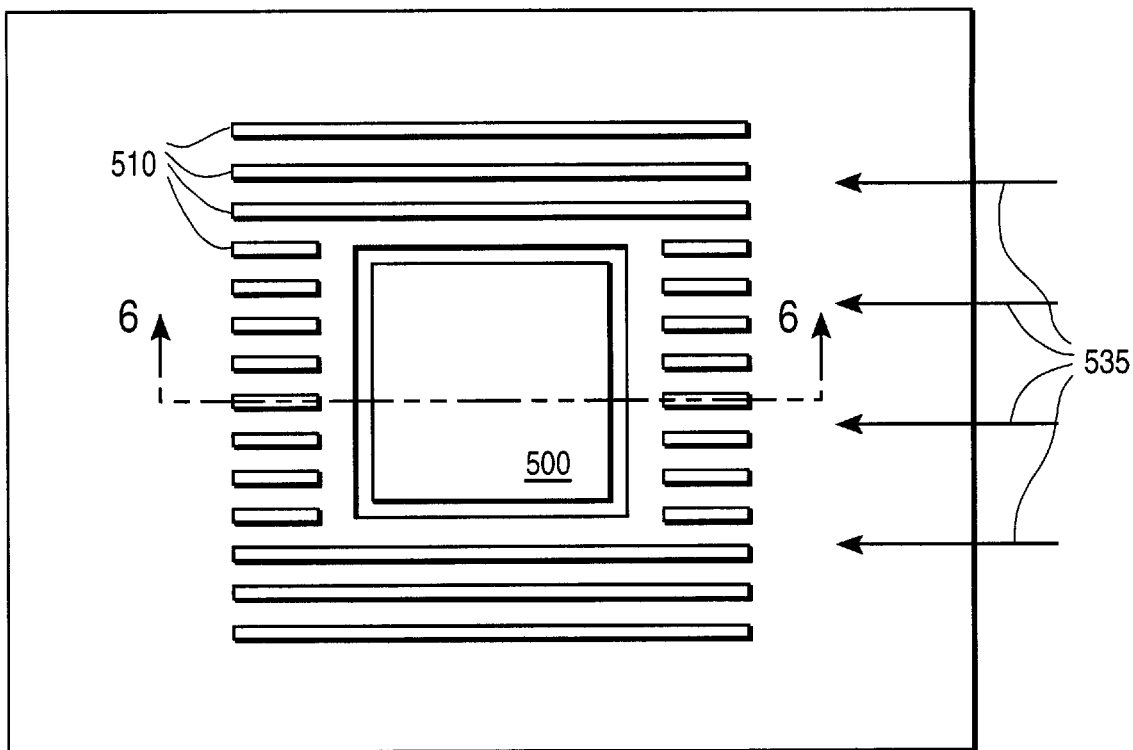
FIG. 5 is a top view of an integrated circuit device mounted on a board of another embodiment that includes conductive fins as board heat dissipation elements.

FIG. 5 shows a top view of a packaged IC device 500 mounted on a board 505. Thermally conductive fins 510 are connected to the board 505.

Figure 6:
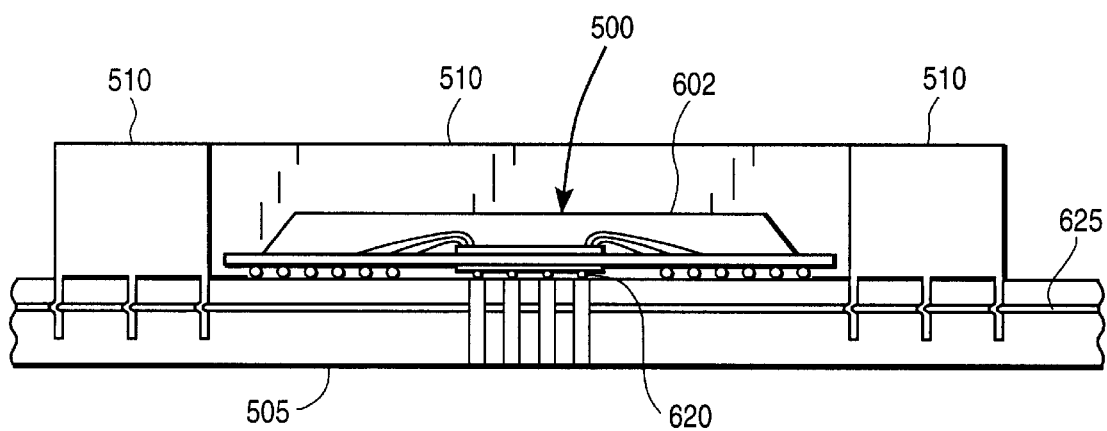
FIG. 6 is a cross-section of the integrated circuit device, board and board heat dissipation elements of FIG. 5 taken along the line 6—6.

FIG. 6 shows a cross-section of the packaged device 500, the board 505 and conductive pins 510 taken at the line 6–6.

The device 500 is also packaged in a PBGA package 602. The board 505 is constructed in a similar manner to the board 305 of FIGS. 3 and 4, including one or more ground layers 625. Further, the PBGA package 602 is similar to the PBGA package 402 of FIGS. 3 and 4 and is mounted on the board 505 in a similar manner.

The fins 510 are thermally coupled to a same ground layer 625 as the ground/cooling terminals 620 of the PBGA package 602. The fins 510 may be coupled to the ground layer(s) 625 in any manner(s) described above with reference to the thermally conductive pins 310. Further, the thermally conductive fins 510 may be coupled to the board 505 either prior to or following mounting of the integrated circuit device 500. For the embodiment shown in FIG. 6, the fins 510 include terminals that can be inserted into plated holes in the board 505 either automatically or manually such that they are directly connected to the ground layer(s) 625. If the fins 510 are mounted to the board 505 prior to a time at which the integrated circuit device 500 is mounted to the board 505, the fins are arranged around a footprint of the integrated circuit device 500.

The thermally conductive fins 510 like the conductive pins 310 described above extend away from a surface of the board 505 and form approximately a right angle with the surface of the board 505. The height of the fins 510 above the top surface of the board 505 depends on design considerations as described above including the system in which the PBGA-packaged device 500 is to be used. The height of the fins 510, like the pins 310, may be in the range of 200 thousandths of an inch to one inch above the surface of the board 505 for one embodiment. The fins 510 are formed of a thermally conductive material such as gold/nickel over copper.

For one embodiment, the fins 510, like the pins 310 are dedicated board heat dissipation elements. Also for one embodiment, commercially available bus bars may be used as the heat dissipation fins. Bus bars are commonly used as a bus to transmit multiple signals between devices coupled to a board. For other embodiments, other types of fins may be used.

Referring again to FIG. 5, the fins 510 are arranged such that the longitudinal axes of all of the fins 510 are parallel to each other. The fins 510 are also parallel to the direction (or anticipated direction) 535 of maximum airflow in the system in which the board 505 is to be used. The direction 535 of maximum airflow may be determined by the location of a fan in the system, vents providing airflow and/or orientation of the board 505 in the system for example. With the fins 510 arranged parallel to the direction 535 of airflow, the air can move freely across more surface area of the fins 510 to provide for more rapid cooling.

The fins 510 include long fins extending on opposite sides of the integrated circuit device 500 parallel to the direction of airflow. Shorter fins are provided around the remaining sides of the integrated circuit device 500. In this manner, the integrated circuit device 500 is substantially surrounded by fins 510 to provide significantly more surface area for cooling as compared to similar integrated circuit devices on similar boards that do not include such board heat dissipation elements.

Figure 7:
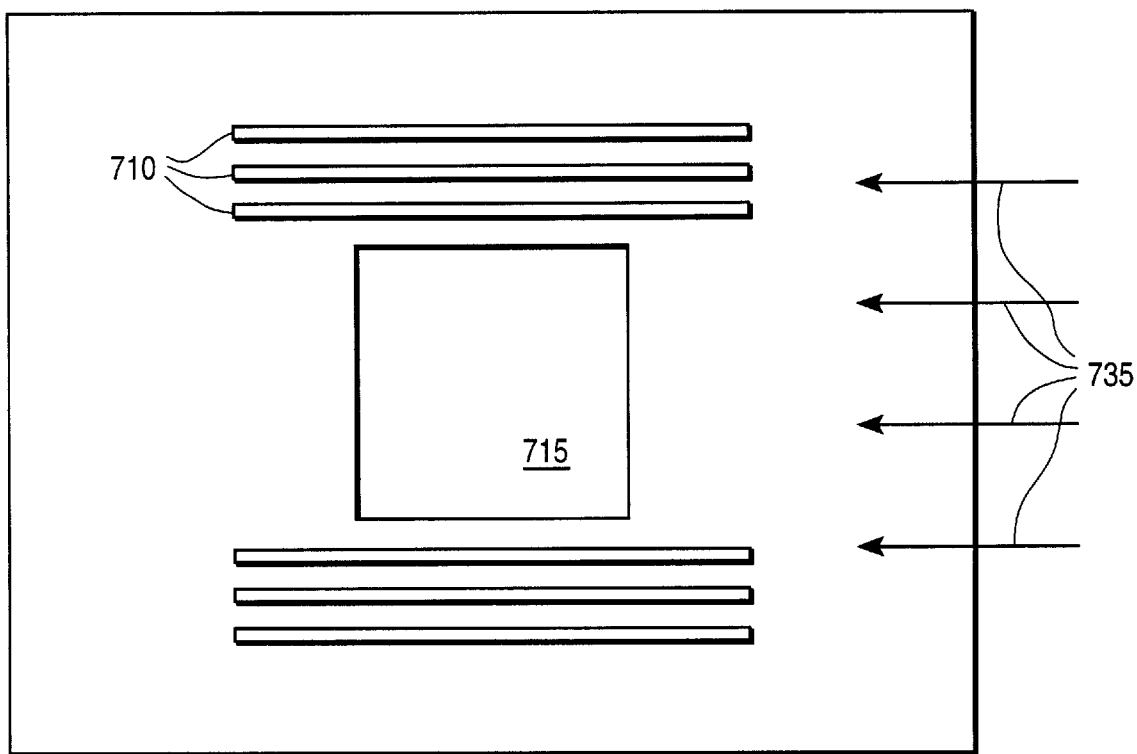
FIG. 7 is a top view of a board of another embodiment that includes another arrangement of conductive fins around an integrated circuit device footprint.

Many different heat dissipation element types and arrangements may be used in accordance with the invention. FIG. 7, for example, is an overhead view of a board 705 including heat dissipation elements of another embodiment. The heat dissipation elements of the embodiment shown in FIG. 7 are also fins 710, but the fins 710 are provided on only two sides of an integrated circuit device footprint 715. The footprint 715 indicates the location in which an integrated circuit device, such as the previously described integrated circuit devices 300 and 500, is to be mounted on the board 705. Similar to the embodiment described in reference to FIGS. 5 and 6, the fins 710 are mounted to the board 705 such that their longitudinal axes are parallel to the direction 735 of airflow over the board 705.

Figure 8:
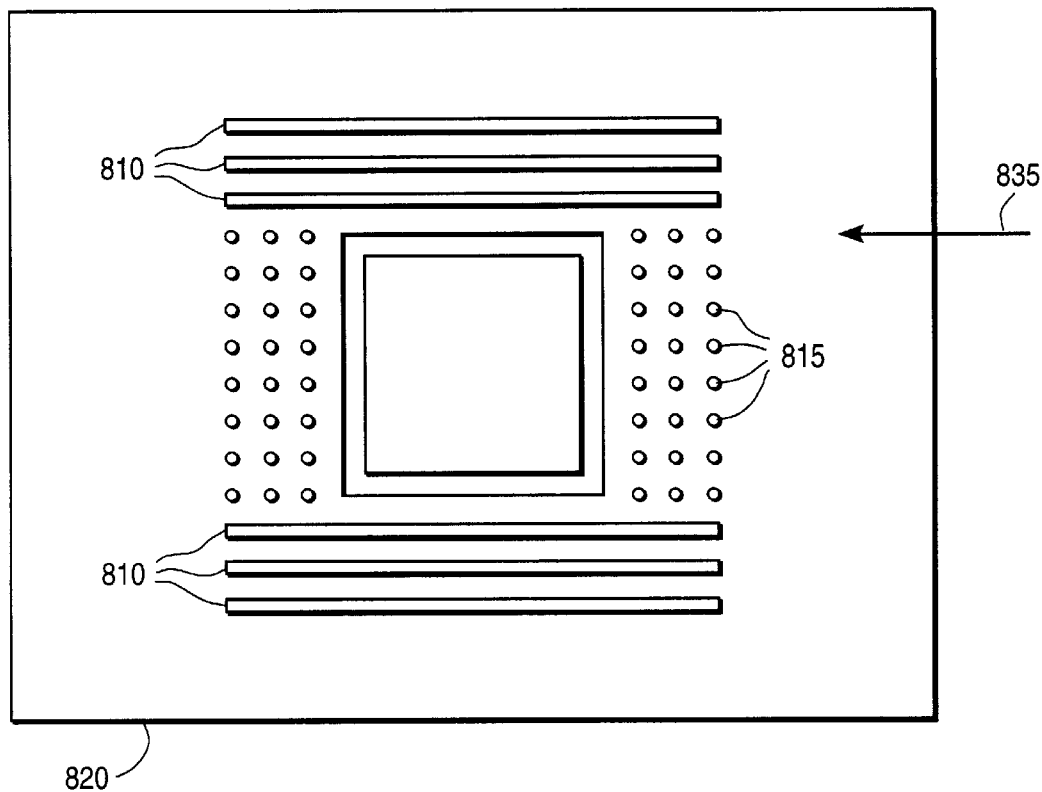
FIG. 8 is a top view of an integrated circuit device mounted on a board of another embodiment that includes both conductive fins and pins as board heat dissipation elements.

FIG. 8 shows an overhead view of another embodiment for which a combination of fins 810 and pins 815 are used as heat dissipation elements for a board 820 in a manner similar to the embodiments described above.

Figure 9:
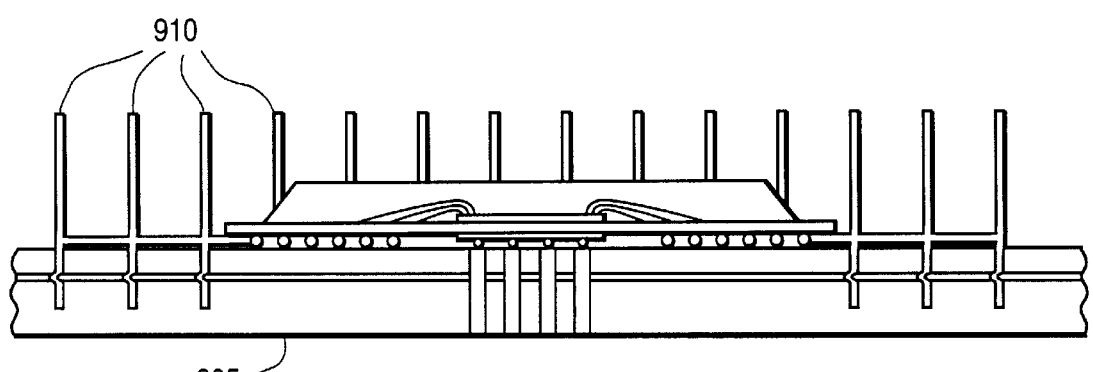
FIG. 9 is a cross-section view of a PBGA-packaged device mounted on a board that includes a board heat dissipation element of another embodiment.

FIG. 9 shows a cross-section of a unitary board heat dissipation element comprising multiple interconnected pins or fins 910. The single unit board heat dissipation element 910 of FIG. 9 is mounted to the board 905 in a single step and may be formed in a different shape for other embodiments. The board heat dissipation element 910 is used in the same manner and provides similar advantages to the board heat dissipation elements described above in reference to other embodiments. Other configurations for single unit heat dissipation elements are also within the scope of the invention.

Figure 10:
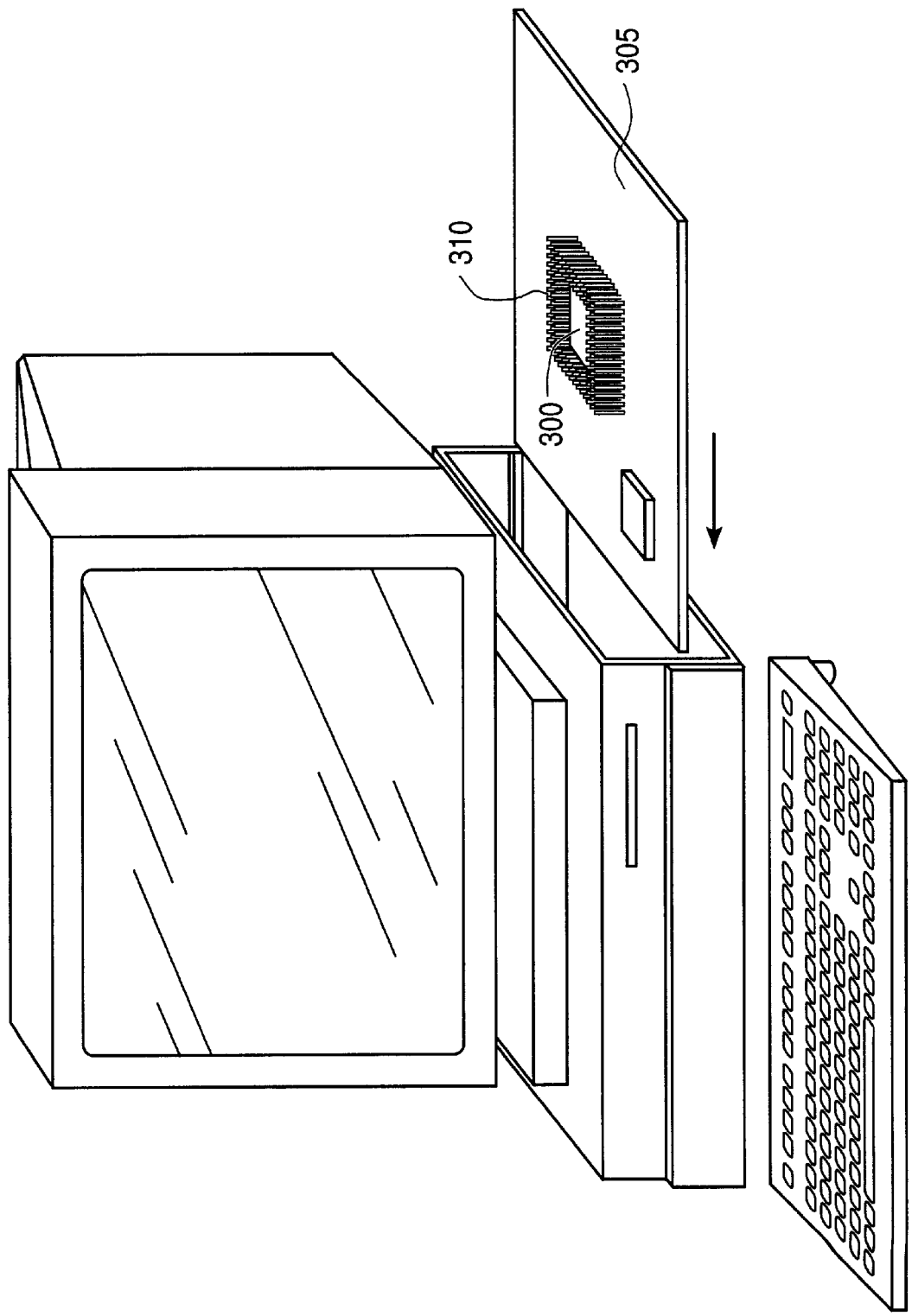
FIG. 10 shows a computer system including the circuit board, board heat dissipation elements and integrated circuit device of FIGS. 3 and 4.

Boards including heat dissipation elements of any of the above-described embodiments may be used in systems such as computer systems, set-top boxes, or printers, for example. FIG. 10 shows the board 305, integrated circuit device 300 and conductive pins 310 of FIGS. 3 and 4 in use in a personal computer system 1000. The conductive pins 310 help to cool the board 305 as described above by quickly dissipating heat from the board 305 ground layer(s). Improved board 305 cooling provided by the conductive pins 310 may give a computer system 1000 designer more flexibility for device placement on the board, board clearance if the conductive pins 310 help to eliminate a heat sink, and/or may help to remove the need for one or more additional cooling devices in the computer system 1000.

It will be appreciated that other types of heat dissipation elements and/or different arrangements may be used in accordance with other embodiments. For example, heat dissipation elements having different shapes and extending away from a printed circuit board in different directions, from different surfaces, or at different angles may also be used.

For some embodiments, a heat sink or heat pipe connected to an integrated circuit device may be used in conjunction with the board heat dissipation elements to cool the device. For other embodiments, use of heat dissipation elements as described above obviates the need for a separate heat sink or heat pipe connected to the integrated circuit device.

Reducing or eliminating a need for a heat sink is particularly advantageous for integrated circuit devices in plastic packages. The plastic material used to form a plastic package tends to be a good thermal insulator preventing heat from an encapsulated integrated circuit die from being easily transferred to a heat sink on the package.

For other devices, the use of the above described heat dissipation elements instead of a heat sink may allow a board to fit into a narrower space in a system, for example, if the height of the heat dissipation elements is less than the height of a heat sink connected to an integrated circuit device.

It will be appreciated that means other than the ground/ cooling terminals described herein may be used with different types of packages to transfer heat from an integrated circuit device to a conductive plane in a board. Further, heat may be dissipated through a conductive layer in a board other than a ground plane such as a plane provided solely for heat dissipation or a plane at a reference voltage other than ground. In this case, the board heat dissipation elements are thermally coupled to the heat dissipation layer, the reference voltage plane or another conductive layer other than a ground layer.

The above-described embodiments provide several advantages. The board heat dissipation elements help to quickly and efficiently dissipate heat transferred to a board such as a printed circuit board. Faster cooling of an integrated circuit device can increase the life of the integrated circuit device and reduce reliability concerns.

Further, the board heat dissipation elements may also help to dissipate heat from other surrounding devices to the ambient before it reaches a device to be cooled. For these reasons, a motherboard, for example, can be used as a heat sink for packages such as a PBGA package without causing the heat transferred to the motherboard to be trapped between insulator layers. Also, for some embodiments, the board heat dissipation elements can reduce or eliminate the need for other cooling devices.

The board heat dissipation elements provide the above advantages with little to no board real estate penalty for some embodiments.

In the foregoing specification, the invention has been described with reference to specific exemplary embodiments thereof. It will, however, be appreciated that various modifications and changes may be made thereto without departing form the broader spirit and scope of the invention as set forth in the appended claims. The specification and drawings are, accordingly, to be regarded in an illustrative rather than a restrictive sense.

What is claimed is:

1. An apparatus comprising:
    a board on which to mount an electronic device, the board including a conductive heat dissipation layer; and
    an array of board heat dissipation elements thermally couplet the conductive heat dissipation layer, the array including a first board heat dissipation element, the first board heat dissipation element having a first end and a second end wherein the first end thermally coupled to the conductive heat dissipation layer, and wherein the second end extends away from a surface of the board to dissipate heat from the conductive heat dissipation layer to an ambient and does not couple to another device, and further wherein the array is arranged in a pattern that substantially surrounds a footprint of the electronic device on the board.

2. The apparatus of claim 1 wherein the board heat dissipation element is one of a thermally conductive pin or fin.

3. The apparatus of claim 1 wherein the electronic device is thermally coupled to the conductive heat dissipation layer when mounted to the board.

4. The apparatus of claim 1 wherein the electronic device is an integrated circuit in a ball grid array package.

5. The apparatus of claim 1 wherein the surface is the surface on which the electronic device is to be mounted.

6. An apparatus for dissipating heat transferred to a circuit board by an integrated circuit device to be mounted on the circuit board, the apparatus comprising:
    an array of board heat dissipation elements thermally coupled to a conductive heat dissipation layer of the circuit board, the array including a first board heat dissipation element, the first board heat dissipation element having a first end and a second end wherein the first end is thermally coupled to the conductive heat dissipation layer, and wherein the second end extends away from a surface of the circuit board to dissipate heat from the conductive heat dissipation layer to an ambient and does not couple to another device, and further wherein the array is arranged outside a footprint of the integrated circuit device to be mounted on the circuit board.

7. The apparatus of claim 6 wherein each of the board heat dissipation elements is one of a thermally conductive pin or fin.

8. The apparatus of claim 6 wherein the surface is the surface on which the integrated circuit device is to be mounted.

9. The apparatus of claim 6 wherein the integrated circuit device is thermally coupled to the conductive heat dissipation layer of the circuit board when the integrated circuit device is mounted on the circuit board to conduct heat from the integrated circuit device to the conductive heat dissipation layer.

10. A printed circuit board for interconnecting electronic devices comprising:

a conductive heat dissipation layer;

an integrated circuit device coupled to the printed circuit board; and an array of board heat dissipation elements thermally coupled to the conductive heat dissipation layer of the printed circuit board, the array including a first board heat dissipation element, the first board heat dissipation element having a first end and a second end wherein the first end is thermally coupled to the conductive heat dissipation layer, and wherein the second end extends away from a surface of the printed circuit board to dissipate heat from the conductive heat dissipation layer to an ambient and does not couple to another device, and further wherein the array is arranged outside the integrated circuit device.

11. The printed circuit board of claim 10 wherein the integrated circuit device is directly connected to the conductive heat dissipation layer to conduct heat from the integrated circuit device to the conductive heat dissipation layer.

12. The printed circuit board of claim 10 wherein each of the board heat dissipation elements is one of a thermally conductive pin or fin.

13. The printed circuit board of claim 10 wherein the surface is the surface on which the integrated circuit device is coupled.

14. A computer system comprising:

a printed circuit board including a conductive heat dissipation layer;

an integrated circuit device coupled to the conductive heat dissipation layer; and an array of board heat dissipation elements thermally coupled to the conductive heat dissipation layer of the printed circuit board, the array including a first board heat dissipation element, the first board heat dissipation element having a first end and a second end wherein the first end is thermally coupled to the conductive heat dissipation layer, and wherein the second end extends away from a surface of the printed circuit board to dissipate heat from the conductive heat dissipation layer to an ambient and does not couple to another device, and further wherein the array is arranged outside the integrated circuit device.

15. The computer system of claim 14 wherein each element of the array of board heat dissipation elements is one of a thermally conductive pin or fin.

16. The computer system of claim 14 wherein the integrated circuit device is directly connected to the conductive heat dissipation layer to transfer heat from the integrated circuit device to the conductive heat dissipation layer during operation.

17. The computer system of claim 14 wherein the surface is the surface on which the integrated circuit device is coupled.

* * * * *

UNITED STATES PATENT AND TRADEMARK OFFICE
CERTIFICATE OF CORRECTION

PATENT NO. : 5,933,324
DATED : August 3, 1999
INVENTOR(S) : Joseph C. Barrett

It is certified that error appears in the above-indentified patent and that said Letters Patent is hereby corrected as shown below:

In column 4 at line 34 delete "PEBGA" and insert -- PBGA --

In column 6 at line 49 insert -- , -- before "for" and following "system"

In column 8 at line 39 delete "couplet" and insert -- coupled --

In column 8 at line 42 insert -- is -- before "thermally" and following "end"

In column 9 at line 32 insert -- is -- before "thermally" and following "end"

Signed and Sealed this

Twenty-third Day of November, 1999

Attest:

Q. TODD DICKINSON

*Attesting Officer*   *Acting Commissioner of Patents and Trademarks*